United States Patent

Sato et al.

[11] Patent Number: 6,054,351
[45] Date of Patent: Apr. 25, 2000

[54] METHOD OF EVALUATING A TUNNEL INSULATING FILM

[75] Inventors: Yasushi Sato; Masao Tsujimoto, both of Tokyo, Japan

[73] Assignee: Oki Electric Industry Co., Ltd., Tokyo, Japan

[21] Appl. No.: 08/820,720

[22] Filed: Mar. 18, 1997

[30] Foreign Application Priority Data

Mar. 19, 1996 [JP] Japan .................................. 8-063030

[51] Int. Cl.[7] .............................................. H01L 21/8247
[52] U.S. Cl. .............................................. 438/264; 438/18
[58] Field of Search .................. 438/10, 11, 17, 438/18, 258, 263, 264, 594

[56] References Cited

U.S. PATENT DOCUMENTS

| 4,243,937 | 1/1981 | Multani et al. ........................... 438/18 |
| 5,541,129 | 7/1996 | Tsunoda .................................. 438/264 |
| 5,604,699 | 2/1997 | Cappelletti et al. ................ 365/185.22 |

FOREIGN PATENT DOCUMENTS 4-278554    5/1992    Japan .

Primary Examiner—Chandra Chaudhari
Attorney, Agent, or Firm—Venable; Robert J. Frank; Catherine M. Voorhees

[57] ABSTRACT

The present invention provides a method of evaluating a tunnel insulating film of a first MOS FET having a semiconductor substrate, a control gate, a floating gate and a tunnel insulating film formed between the semiconductor substrate and the floating gate which is injected with electrons from the semiconductor substrate by applying a direct current voltage to the control gate. The method is achieved by preparing a second MOS FET having a tunnel insulating film formed on a semiconductor substrate in the same batch process of forming the tunnel insulating film in the first MOS FET, measuring a subthreshold swing of the second MOS FET, applying a direct current electric field to the tunnel insulating film in the second MOS FET for a predetermined time, remeasuring the subthreshold swing of the second MOS FET, and evaluating the tunnel insulating film in the first MOS FET by using a change of the subthreshold swing before and after the applying step.

9 Claims, 13 Drawing Sheets

METHOD OF EVALUATING A TUNNEL INSULATING FILM

CROSS REFERENCE TO RELATED APPLICATION

This application claims the priority of Japanese Patent Application Serial No. 08-063030, filed Mar. 19, 1996, the subject matter of which is incorporated herein by reference.

BACKGROUND OF THE INVENTION

This invention relates to a method of evaluating a tunnel insulating film, and in particular, to a method of evaluating a tunnel insulating film of an MOS FET (metal oxide semiconductor field-effect transistor) having a dual gate structure, for example a cell transistor of a flash memory device.

FIGS. 1a and 1b are sectional views showing a conventional dual gate MOS FET used as a cell transistor of a flash memory device. FIG. 1a is a vertical section along the direction of source and drain regions. FIG. 1b is a vertical section along the direction perpendicular to FIG. 1a.

In the MOS FET shown in FIGS. 1a and 1b, a tunnel insulating film 105 and a field insulating layer 111 are formed on a monocrystalline silicon substrate 101. A floating gate 106, a silicon insulating layer 107, a control gate 108 and an insulating layer 109 are deposited on the tunnel insulating film 105 and the field insulating layer 111 one after another. A metal layer 110 is formed on the insulating layer 109 and connected to the control gate 108. A channel region 104 is formed in the surface of the substrate 101 between a source region 103 and a drain region 102 under an applied voltage. W1 in FIG. 1b shows the width of the channel region 104.

Data can be erased by injecting electrons from the channel region 104, the source region 103 and the drain region 102 into the floating gate 106 through the tunnel film 105. Data can be written by discharging the electrons from the floating gate 106 into the drain region 102 through the tunnel film 105. The flow of the electrons through the tunnel film 105 is called "Fowler/Nordheim (FN) tunnel current". The threshold voltage of the MOS FET in an erasing state (Vte) is higher than the threshold voltage in a writing state (Vtw). The difference between Vte and Vtw is called the Vt Window.

In such an MOS FET, the Vte falls and the Vtw rises, namely, the Vt Window decreases as the result of rewriting data over and over again. The decrease of the Vt Window prevents the data from judging exactly. It is thought that the threshold voltages change because electrons and holes are trapped within the tunnel film or the interface state formed between the tunnel film and the semiconductor substrate. Since the degree of changes of the threshold voltages depend on the quality of the tunnel film (the better the quality of the tunnel film is, the smaller the changes in the threshold voltages after rewriting data over and over again), it is important to evaluate the quality of the tunnel film in order to establish the electrical characteristics and reliability of the flash memory.

The quality of the tunnel film is conventionally evaluated by measuring the changes in the threshold voltages (Vte and Vtw) after rewriting data over and over again.

FIG. 2 is a flowchart which shows conventional steps carried out to evaluate the quality of the tunnel film. In this figure, first, Vtw is measured before rewriting data (step 121). Next, the data is erased (step 122) and Vte is measured (step 123). As an example, data is erased by applying a control gate voltage of 18V and a source voltage of 0V to the device with respect to the silicon substrate 101 having a voltage of 0V, and disconnecting the drain. Next, data is written (step 124) and Vtw is measured (step 125). As an example, data is written by applying a drain voltage of 5V and a control voltage of −8V to the device with respect to the silicon substrate 101 having a voltage of 0V and disconnecting the source. Then steps 122 to 126 are repeated.

Steps 122 to 126 are repeated a predetermined number of times, and then the quality of the tunnel film is evaluated from the relation between the number of times rewriting occurred and the Vt Window. Compared with the number of rewriting times and the smaller the decrease in the Vt Window, the better the quality of the tunnel film.

In this case it takes a relatively long time to evaluate the quality of the tunnel film because the data is actually rewritten. For example, it takes 1 hour to repeat rewriting one hundred thousand times. Further, sometimes the Vt Window fails to change in spite of being rewritten one hundred thousand times.

SUMMARY OF THE INVENTION

It is an object of the present invention to provide a method of evaluating a tunnel insulating film, wherein the time to evaluate the tunnel insulating film can be shortened.

According to an aspect of the present invention, for achieving the above object, there Is provided a method of evaluating a tunnel insulating film of a first MOS FET having a semiconductor substrate, a control gate, a floating gate formed between the semiconductor substrate and the control gate and a tunnel insulating film formed between the semiconductor substrate and the floating gate, wherein the floating gate is injected with electrons from the semiconductor substrate by applying a direct current voltage to the control gate, said method comprising the steps of:

preparing a second MOS FET or another kind of semiconductor device having a tunnel insulating film formed on a surface of a semiconductor substrate in the same batch process of forming the tunnel insulating film in the first MOS FET, and a gate formed on the tunnel insulating film;

measuring a subthreshold swing of the second MOS FET or the semiconductor device;

applying a predetermined direct current electric field to the tunnel insulating film by applying a direct current voltage between the semiconductor substrate and the gate in the second MOS FET or the semiconductor device for a predetermined time;

remeasuring the subthreshold swing of the second MOS FET or the semiconductor device; and evaluating the tunnel insulating film in the first MOS FET by using a change of the subthreshold swing before and after the applying step.

The subthreshold swing (S) is defined as;

$$S = \ln 10 \cdot dVg/d(\ln ID).$$

The subthreshold swing signifies how much Vg (gate voltage) needs to be decreased in order to decrease a division of the Id (drain current) (See FIG. 6). The more the subthreshold swing, the more undesirable cutoff current (Id at the Vg=0) is generated.

With the decrease of the Vt Window of the MOS FET, the subthreshold swing increases. These two factors, decrease of the Vt Window and increase of the subthreshold swing are correlated.

Accordingly, the method of evaluating the tunnel insulating film of the present invention, as described above, shortens the time required to evaluate the tunnel insulating film, because it can be evaluated from the change of the subthreshold swing while applying a predetermined direct current electric field to the tunnel insulating film by applying a direct current voltage between the semiconductor substrate and the gate in the second MOS FET or the semiconductor device for measuring.

BRIEF DESCRIPTION OF THE DRAWINGS

FIG. 1a is a vertical section along the direction of the source and drain regions and FIG. 1b is a vertical section along the direction perpendicular to FIG. 1a;

FIG. 3a is a vertical section along the direction of the source and drain regions and FIG. 3b is a vertical section along the direction perpendicular to FIG. 3a;

FIG. 9a is a vertical section along the direction of the source and drain regions and FIG. 9b is a vertical section along the direction perpendicular to FIG. 9a;

FIG. 14a is a vertical section along the direction of the source and drain regions and FIG. 14b is a vertical section along the direction perpendicular to FIG. 14a.

DETAILED DESCRIPTION OF THE PREFERRED EMBODIMENTS (First embodiment of the invention)

Figure 3A:
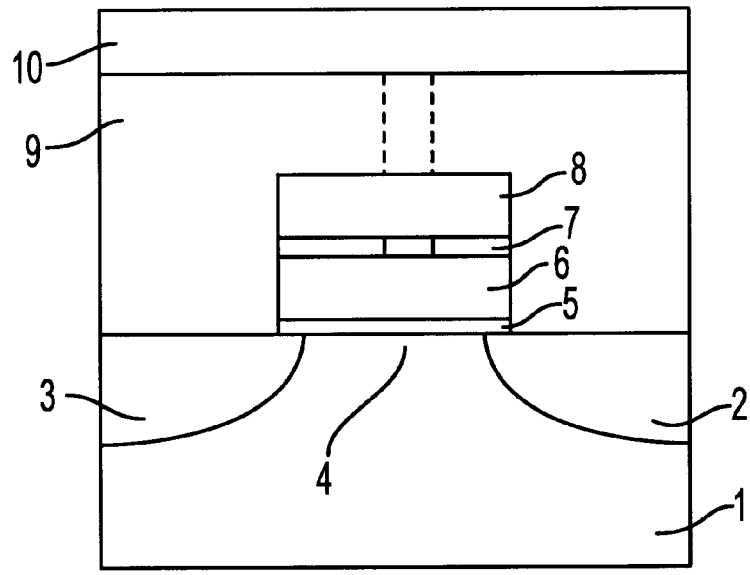
FIGS. 3a and 3b are sectional views showing a measuring MOS FET used in a first embodiment of the present invention, particularly
Figure 3B:
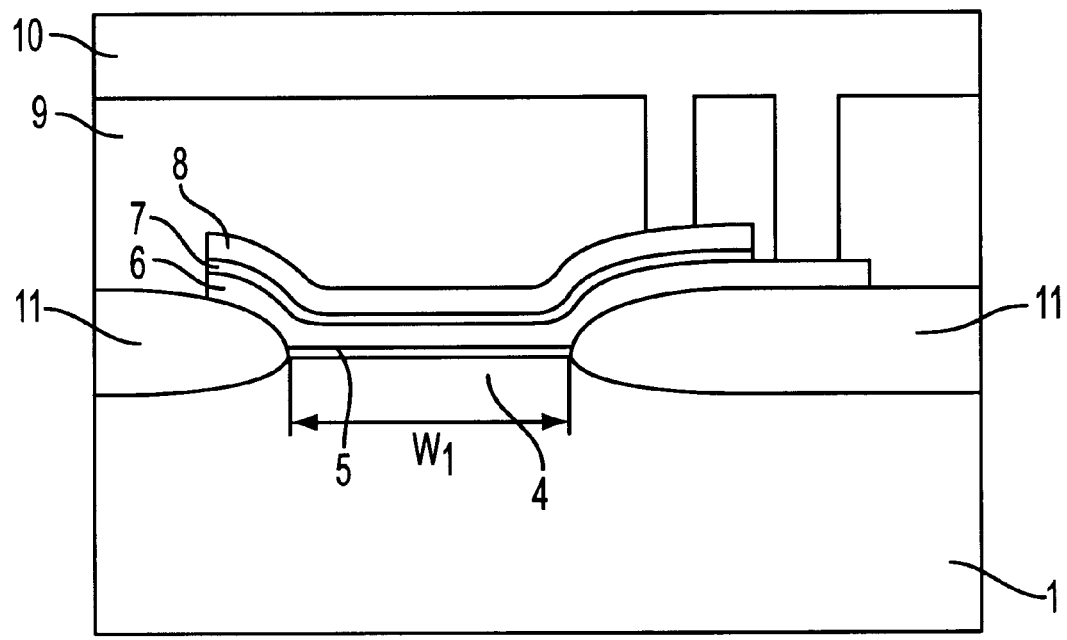

FIGS. 3a and 3b are sectional views showing a measuring MOS FET as a second MOS FET used in the first embodiment of the present invention, particularly FIG. 3a is a vertical section along the direction of the source and drain regions and FIG. 3b is a vertical section along the direction perpendicular to FIG. 3a.

The configuration of the measuring MOS FET shown in FIG. 3a and 3b will be described. A tunnel insulating film 5 having a film thickness of less than 15 nm is formed on a monocrystalline silicon substrate 1. The tunnel film 5 is composed of a SiO2 film or a complex film of SiO2 and silicon nitride. A field oxide film 11 surrounding the tunnel film 5 is formed on the monocrystalline silicon substrate 1. A polycrystalline silicon gate 6 (first gate), a SiO2 film 7 and a polycrystalline silicon gate 8 (second gate) are formed on the tunnel film 5 in this order. Diffusion regions, a drain 2 and a source 3 which have a predetermined conductivity type opposite to that of the substrate 1 are formed in a surface of the substrate 1. A metal layer 10 connects the gate 6 with gate 8 through an insulating film 9. A channel region 4 of the silicon substrate 1 between the drain 2 and the source 3 under the tunnel film 5 functions as a channel.

Figure 1A:
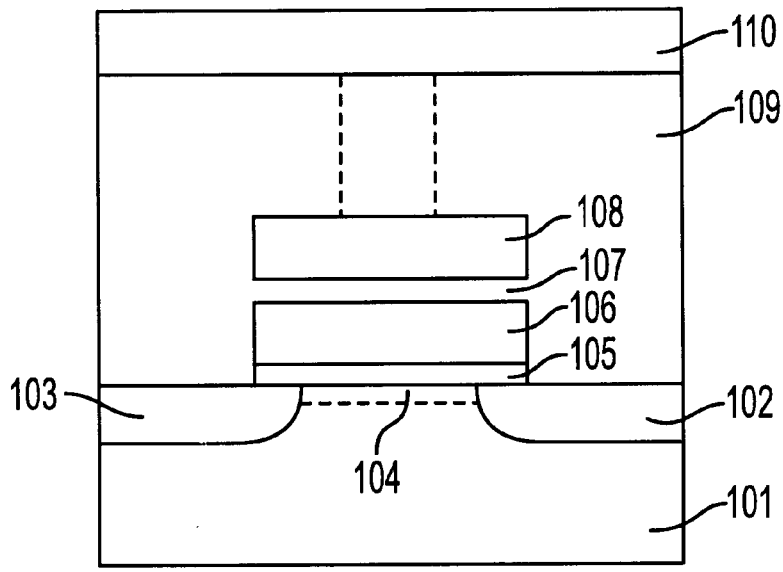
FIGS. 1a and 1b are sectional views showing a conventional dual gate MOS FET used as a cell transistor of a flash memory device, particularly
Figure 1B:
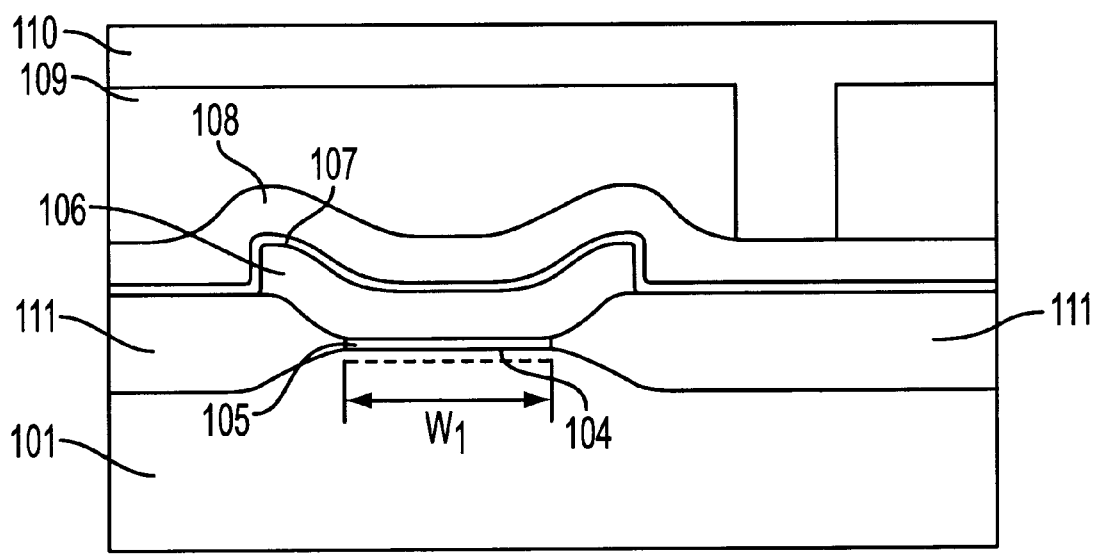

This measuring MOS FET is for evaluating the tunnel insulating film 105 of the MOS FET to be evaluated shown in FIGS. 1a and 1b. The measuring MOS FET is formed on the same wafer as the MOS FET to be evaluated, or on a different wafer in the same batch process used to form the MOS FET to be evaluated. The measuring MOS FET has the same structure and size of pattern as the MOS FET to be evaluated, for example both channels have the same width W1, except that the gate 6 in FIGS. 3a and 3b corresponding to the floating gate 106 in FIGS. 1a and 1b is connected with the gate 8 corresponding to the control gate 108.

Figure 4:
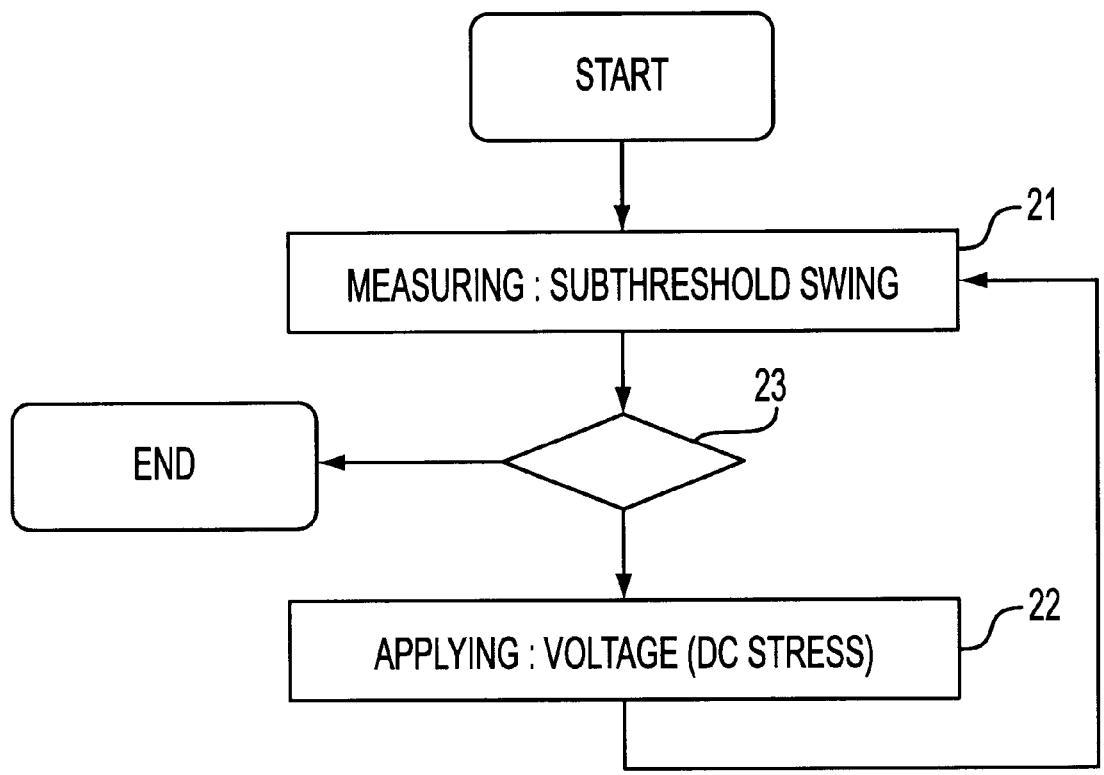
FIG. 4 is a flowchart which shows steps for evaluating the tunnel film according to the first to fourth embodiments of the present invention.

FIG. 4 is a flowchart which shows steps for evaluating the tunnel film according to the first to fourth embodiments of the present invention. First, the measuring MOS FET having the tunnel film 5 is prepared. In a step 21 as shown in FIG. 4, an initial subthreshold swing is found by determining the Vg - Id characteristic of the measuring MOS FET before applying a direct current voltage. Next, in a step 22, the tunnel film 5a is subjected to a predetermined direct current electric field by applying a direct current voltage (DC stress) between the semiconductor substrate 1 and the gate 8 for a predetermined period of time. During this period of time, electrons pass through the tunnel film 5 and are injected into the gate 6 from the substrate 1. Going back to step 21, a subthreshold swing is found by measuring the Vg - Id characteristic of the measuring MOS FET.

In step 23, steps 21 and 22 are repeated alternately till the total number of the DC stress steps reach a predetermined number of times or the subthreshold swing reaches a predetermined value. Then, the tunnel film 5 is evaluated in accordance with the relationship between the subthreshold swing and the time during which the DC stress is applied.

Figure 5:
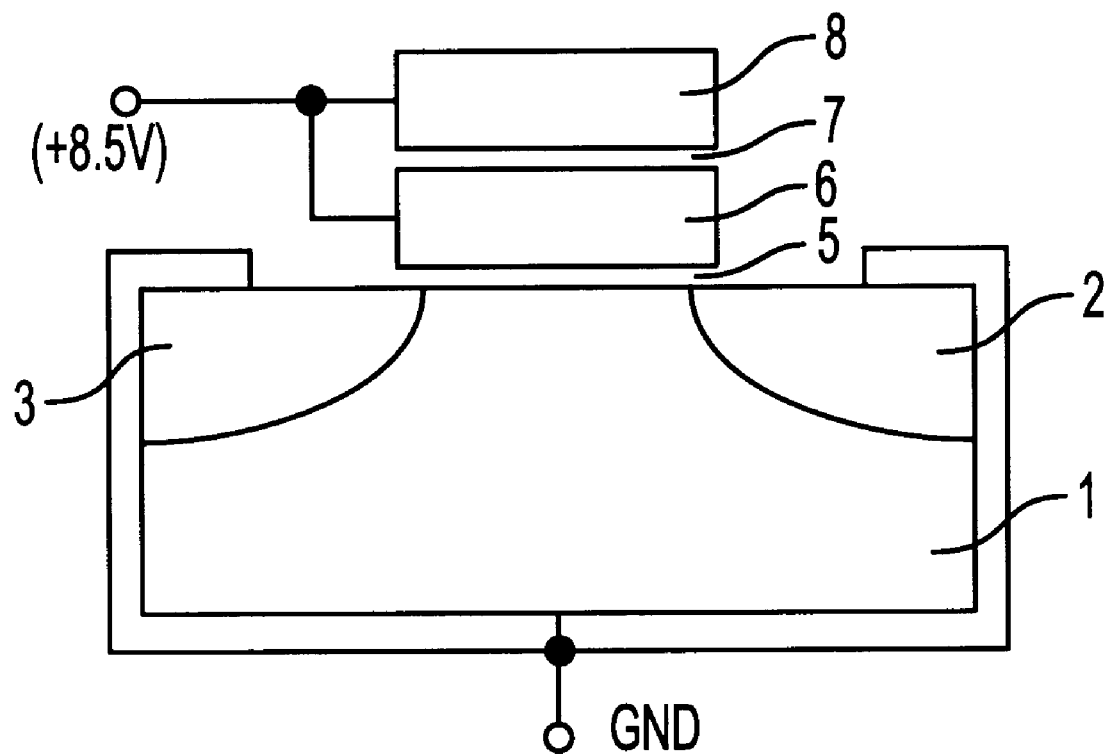
FIG. 5 is a sectional view for explaining a condition of DC stress applied in the first embodiment of the present invention.

FIG. 5 is a sectional view for explaining the condition of DC stress applied in the first embodiment of the present invention. A positive voltage of 8.5 V is applied to the gate 6 and the control gate 8 with respect to the silicon substrate 1 at a voltage of 0V by applying voltage to the metal layer. The drain 2 and source 3 are connected with the substrate 1. A period of time for applying the direct current voltage is for example 10 seconds.

In the MOS FET to be evaluated as shown in FIGS. 1a and 1b, the voltage between the silicon substrate 101 and the floating gate 106 is about 0.6 times as high as the potential difference between the control gate 108 and the silicon substrate 101. The voltage between the substrate 101 and the gate 106 becomes 8.5 V when a positive voltage of 14 V is applied to the control gate 108. The direct current electric fields applied to the tunnel film 5 and the tunnel film 105 are approximately equal, therefore it can be considered that equal electrons are injected, when the positive voltage of 8.5 V is applied to the gate 6 of the measuring MOS FET as shown in FIGS. 3a and 3b and the positive voltage of 14 V is applied to the control gate 108 of the MOS FET to be evaluated as shown in FIGS. 1a and 1b respectively.

Figure 6:
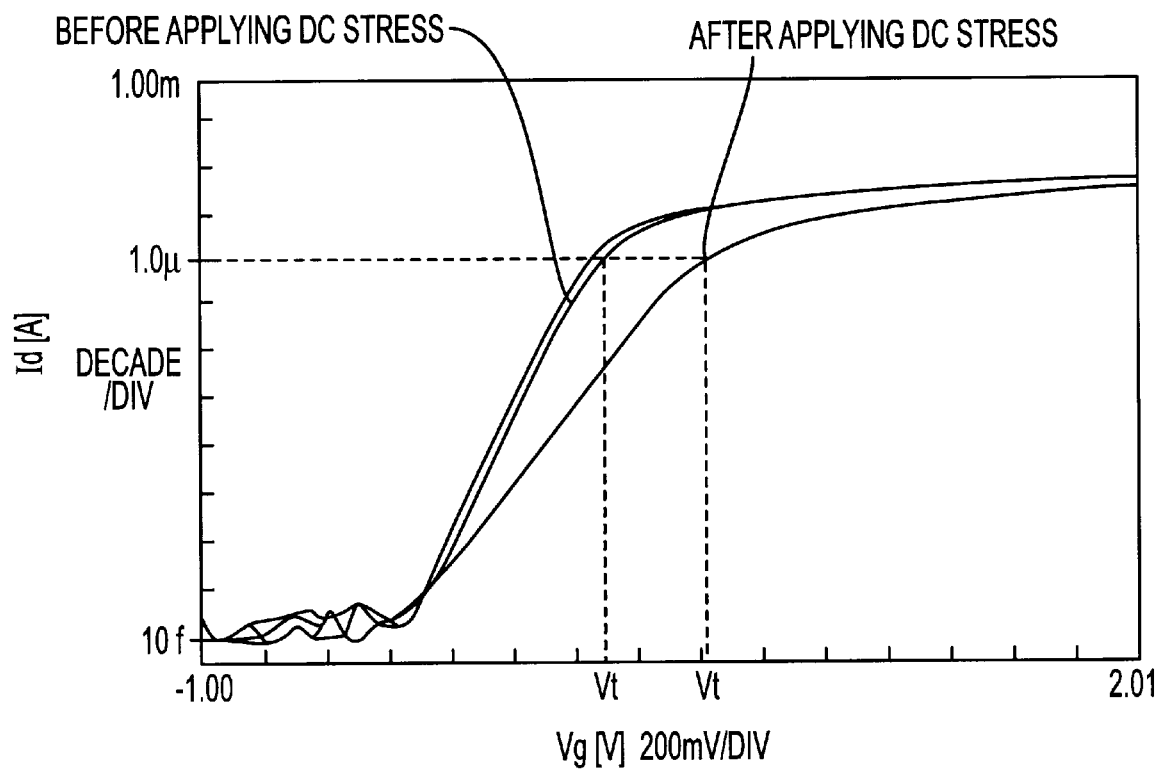
FIG. 6 is a graph for describing the relationship between the gate voltage and drain current of an MOS FET according to the first embodiment of the present invention.

FIG. 6 is a graph for describing the relationship between the gate voltage and the drain current (Vg - Id characteristic) according to the first embodiment of the present invention. As shown in FIG. 6, the more DC stress is applied to the tunnel film 5, the further the rising transit portion (Vg<Vt (Vt: the Vg when the Id is 1 micron A)) of the Vg - Id characteristic curve shifts to the Id ordinate, then the larger the subthreshold swing becomes.

Figure 7:
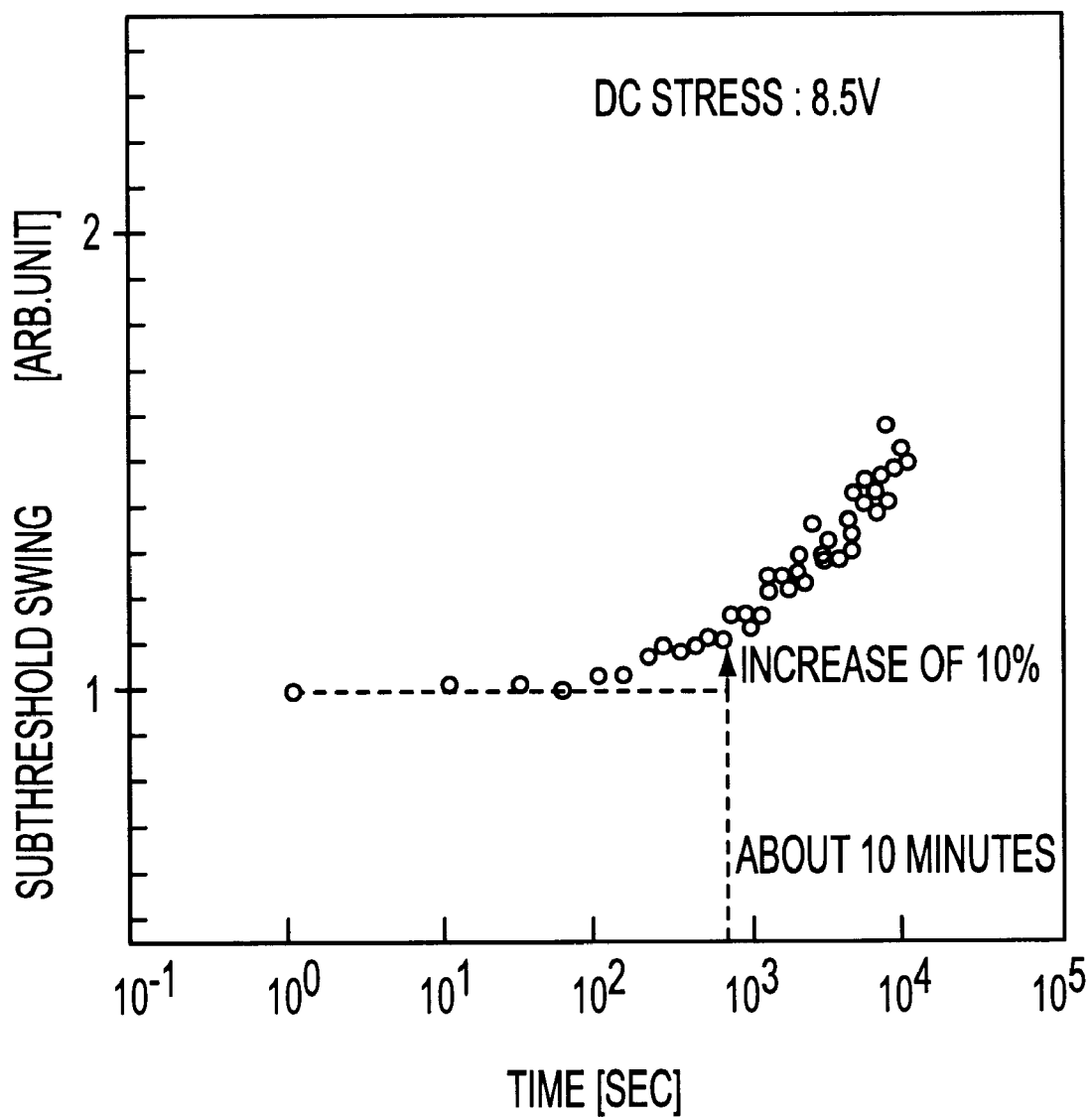
FIG. 7 is a graph for describing the relationship between the subthreshold swing and time when a DC stress applied according to the first embodiment of the present invention.

FIG. 7 is a graph for describing the relationship between a subthreshold swing and the time during which the DC stress is applied according to the first embodiment of the present invention. The time for applying the DC stress represents the total of the times stress is intermittently applied at every step 22. As shown in FIG. 7, an increase of 10% of the subthreshold swing can be seen when the interval during which the DC stress is applied to the tunnel film 5 reaches 10 minutes.

Figure 8:
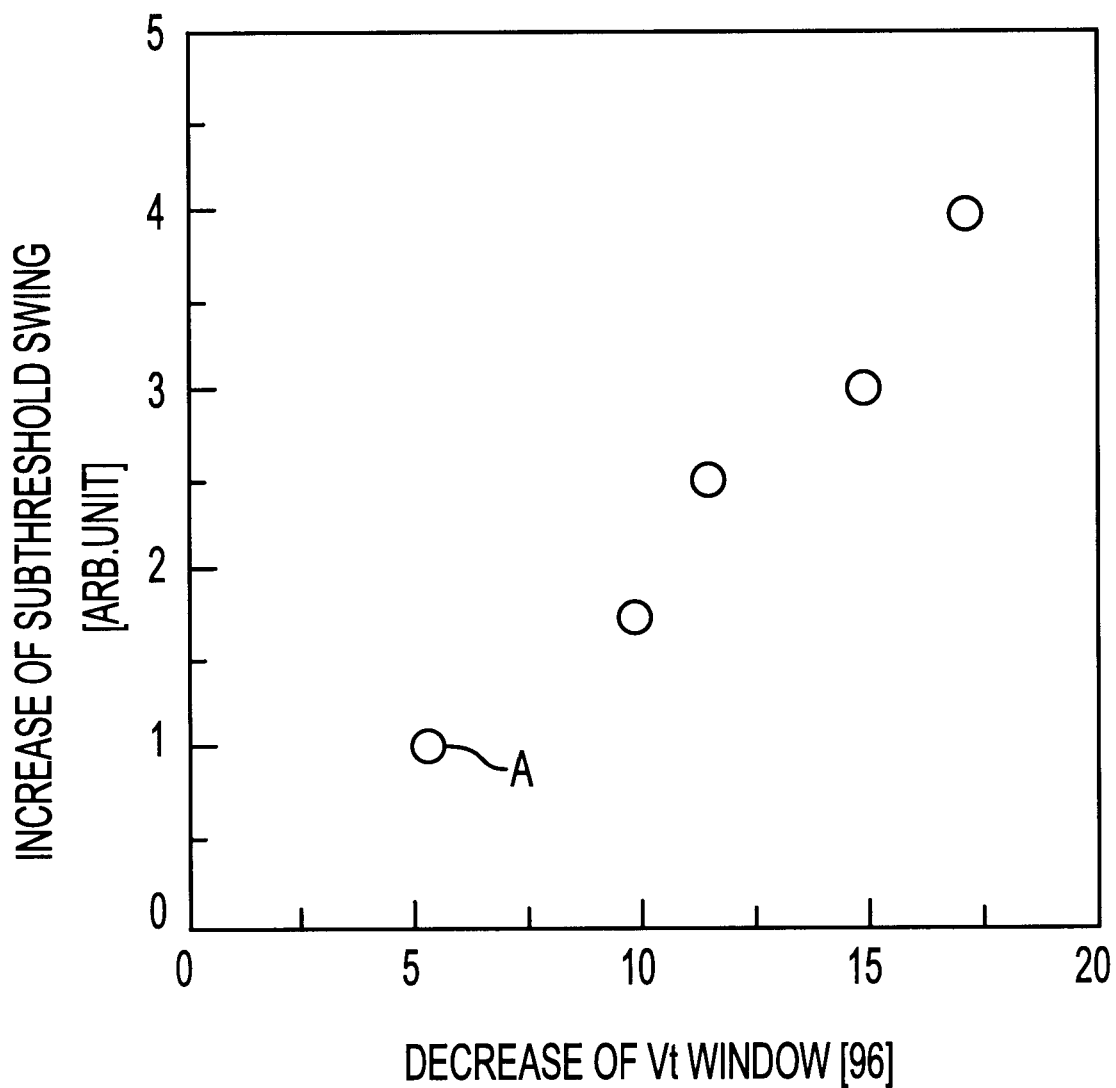
FIG. 8 is a graph for describing the relationship between an increase in the subthreshold swing according to the first embodiment of the present invention and a decrease in the Vt Window according to conventional method.

FIG. 8 is a graph for describing the relationship between the increase in the subthreshold swing according to the first embodiment of the present invention and the decrease in the Vt Window according to a conventional method. It shows that the tunnel film can be evaluated in accordance with the change in the subthreshold swing.

Figure 2:
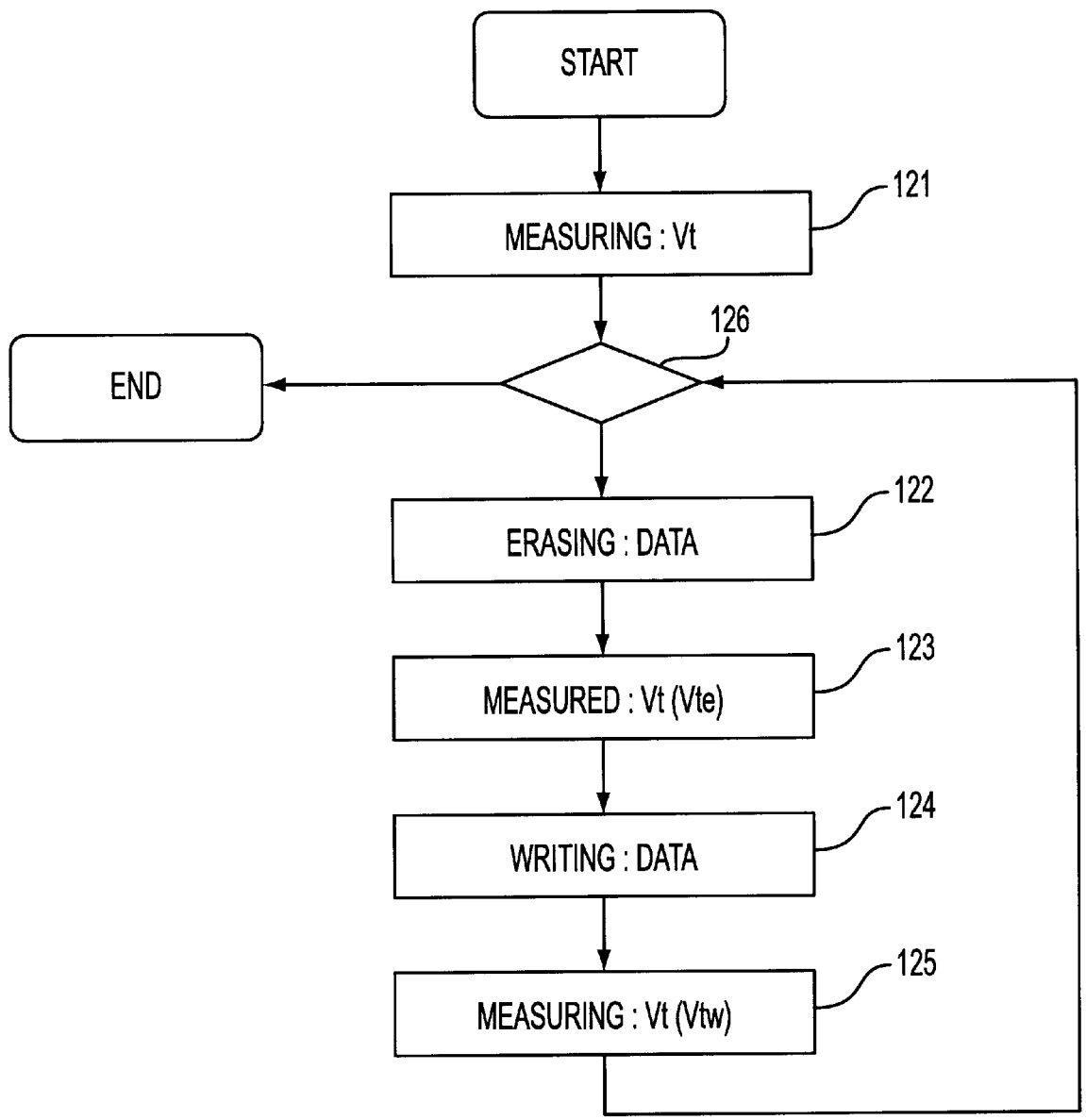
FIG. 2 is a flowchart which shows conventional steps used to evaluate the quality of a tunnel film.

Each point in FIG. 8 represents a relationship, concerning five tunnel films each having different composites, between the increase in the subthreshold swing after the DC stress of 8.5 V is applied to the tunnel film for 1900 seconds and the decrease in the Vt Window after rewriting a hundred thousand times. Concerning the five tunnel films, each point is respectively measured by measuring the measuring MOS FET shown in FIGS. 3a and 3b by means of the steps shown in FIG. 4 and the MOS FET shown in FIGS. 1a and 1b by means of the steps shown in FIG. 2. The increase of the subthreshold swing is standardized by assuming that a value of increase of a tunnel film is 1 as represented by the point marked A in FIG. 8.

As shown in FIG. 8, there is an obvious correlation between the increase in the subthreshold swing and the decrease in the Vt Window. Therefore a tunnel film can be evaluated based on the change of the subthreshold swing.

From the foregoing description according to the first embodiment, the tunnel insulating film 5 can be evaluated, from the change of the subthreshold swing while applying a predetermined direct current electric field to the tunnel insulating film 5, and by applying a direct current voltage between the silicon substrate 1 and the gate 6 in the measuring MOS FET, because it can be assumed that the tunnel film 105 of the MOS FET to be evaluated and the tunnel insulating film 5 have the same quality. Therefore the method of evaluating the tunnel insulating film of the present invention can shorten the time required to evaluate the tunnel insulating film, for example an evaluation of the tunnel film 105 which takes more than an hour by a conventional method can be achieved in about 10 minutes by the method described as the first embodiment of the present invention.

In the first embodiment, the steps 21 and 22 may not be necessarily repeated, namely, the tunnel film can be evaluated as follows. In a step 21 as shown in FIG. 4, an initial subthreshold swing is measured. In a step 22, predetermined direct current electric field is applied to the tunnel film 5 by applying a DC stress for 10 minutes continuously. Going back to step 21, a subthreshold swing is found again. Then those subthreshold swings before and after applying the DC stress are compared.

Figure 9A:
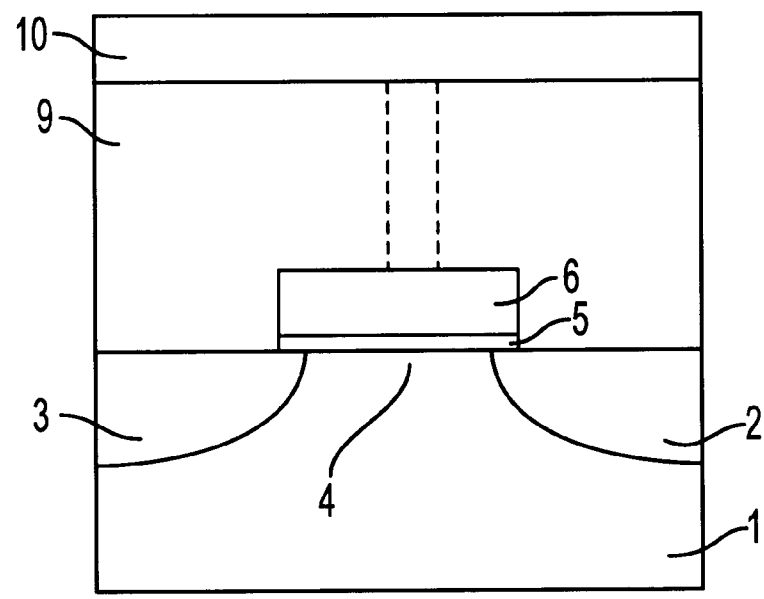
FIGS. 9a and 9b are sectional views showing another measuring MOS FET used in the first embodiment of the present invention, particularly
Figure 9B:
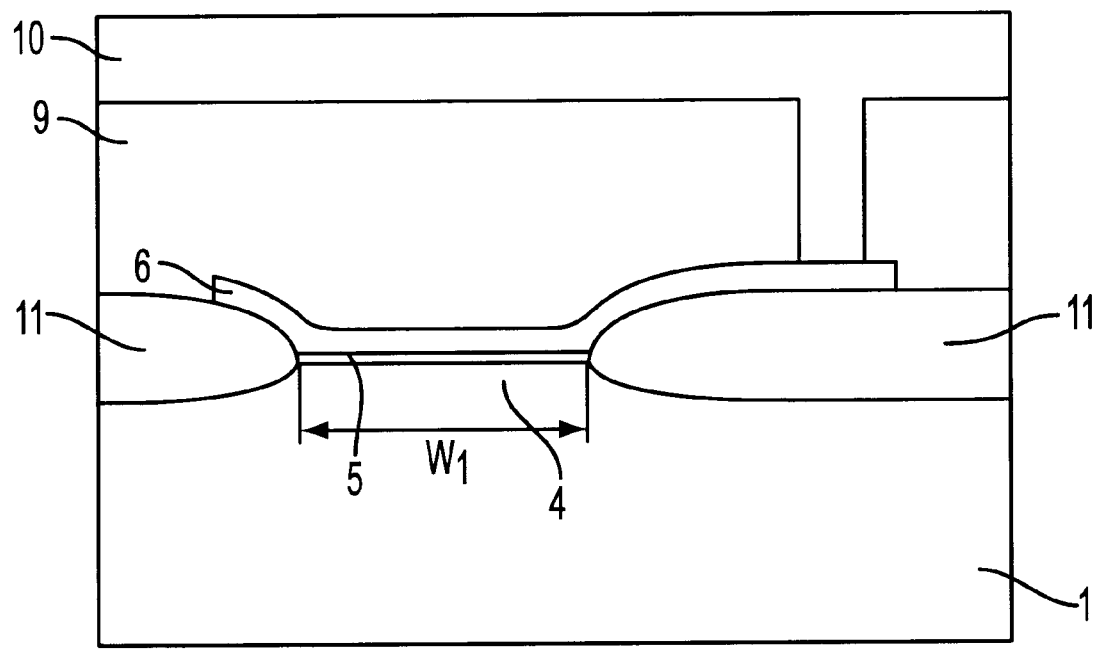

Further, a measuring MOS FET shown in FIGS. 9a and 9b can be used instead of the measuring MOS FET shown in FIGS. 3a and 3b. FIGS. 9a and 9b are sectional views showing another measuring MOS FET used in the first embodiment of the present invention, particularly FIG. 9a is a vertical section along the direction of the source and drain regions and FIG. 9b is a vertical section along the direction perpendicular to FIG. 9a. The measuring MOS FET in FIGS. 9a and 9b have a structure in which the gate 8 and the SiO2 film 7 are removed from the measuring MOS FET in FIGS. 3a and 3b.

(Second embodiment of the invention)

Figure 10:
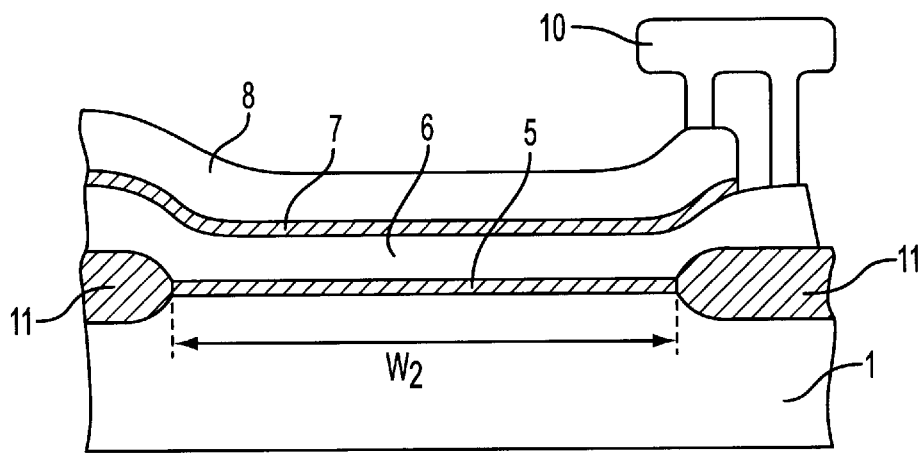
FIG. 10 is a sectional view along the vertical direction of the source and drain regions, showing another measuring MOS FET used in a second embodiment of the present invention.

FIG. 10 is a sectional view along the vertical direction of the source and drain regions, showing another measuring MOS FET used in a second embodiment of the present invention. The measuring MOS FET in FIG. 10 has a channel of which the width (W2) is larger than that one of the measuring MOS FET shown in FIGS. 3a and 3b (W2>W1), namely larger than that one of the MOS FET to be evaluated shown in FIGS. 1a and 1b.

A description will now be made of the case where the tunnel film is evaluated from a relationship between a subthreshold swing and the time during which the DC stress is applied to the tunnel film, the relationship being found by taking the steps shown in FIG. 4 in the same way as in the first embodiment by means of the measuring MOS FET in FIG. 10.

Figure 11:
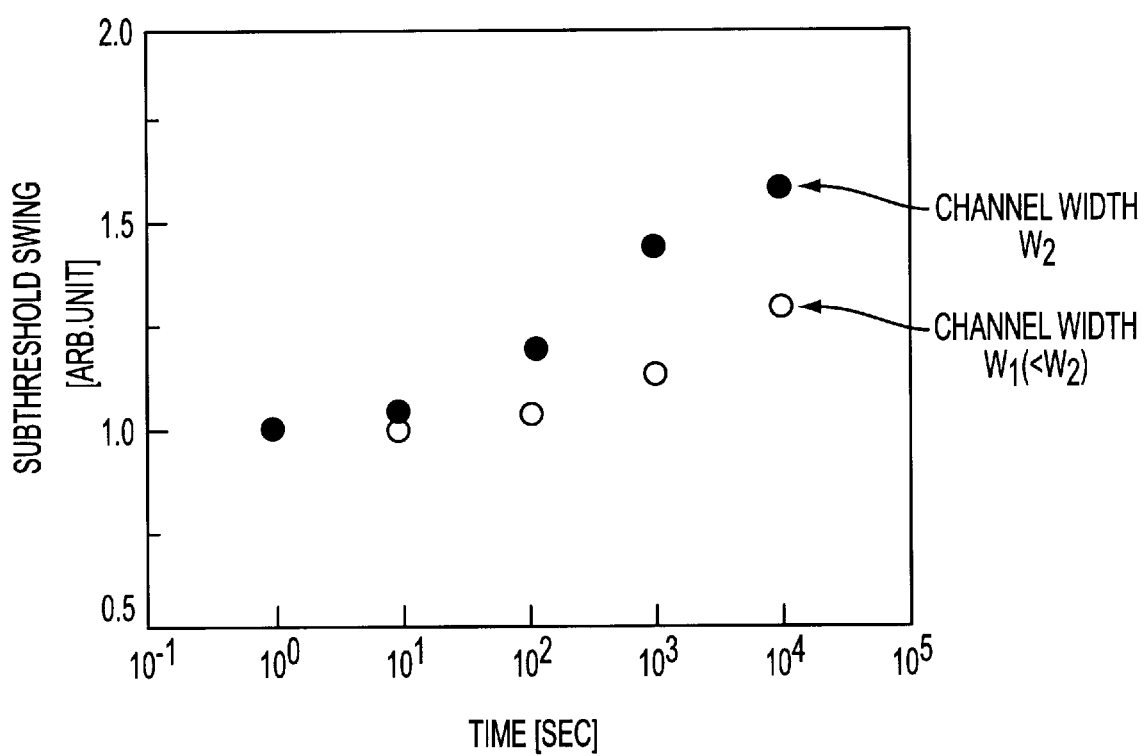
FIG. 11 is a graph for describing the relationship between the subthreshold swing and the time the DC stress is applied according to the second embodiment of the present invention.

FIG. 11 is a graph for describing the relationship (represented by black points) between the time the DC stress is applied, the subthreshold swing of the measuring MOS FET shown in FIG. 10 and the relationship (represented by white points) between the time and the subthreshold swing of the measuring MOS FET shown in FIGS. 3a and 3b which has a channel width of W1 for the purpose of comparison.

As shown in FIG. 11, the subthreshold swing of the measuring MOS FET, which has a wider channel, is changed by applying the DC stress to the tunnel film for a shorter time.

According to the second embodiment of the present invention, the method of evaluating the tunnel insulating film can shorten the time required to evaluate the tunnel insulating film by means of the measuring MOS FET of which the channel is wider than the MOS FET to be evaluated.

A measuring MOS FET which has a structure with gate 8 and SiO2 film 7 removed from the measuring MOS FET shown in FIG. 10 can be applied to the second embodiment instead of the measuring MOS FET in FIG. 10.

(Third embodiment of the present invention)

Figure 12:
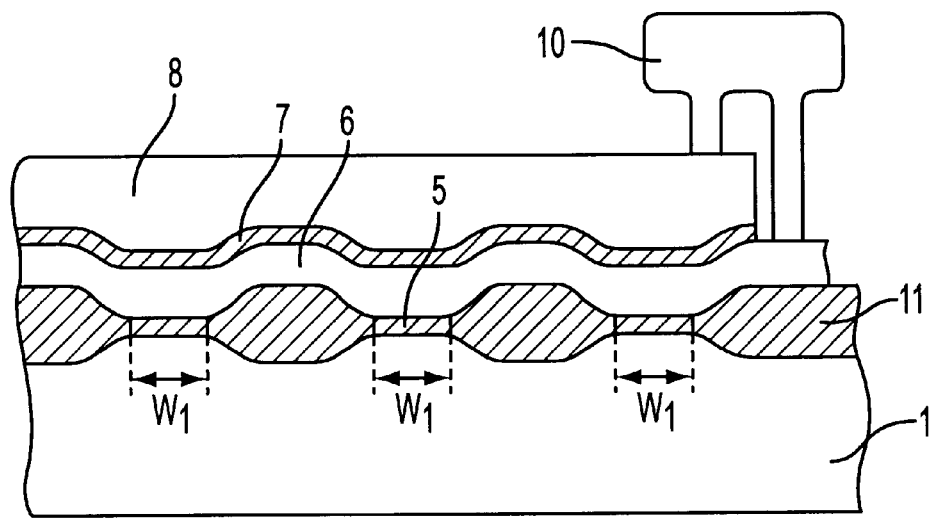
FIG. 12 is a sectional view along the vertical direction of the source and drain regions, showing a measuring semiconductor device used in a third embodiment of the present invention.

FIG. 12 is a sectional view along the vertical direction of the source and drain regions, showing a measuring semiconductor device used in a third embodiment of the present invention. The measuring device shown in FIG. 1 2 has a plurality of measuring MOS FETs shown in FIGS. 3a and 3b located in a row along the vertical direction of the source and drain regions, and a common gate 6 and common gate 8 connected to each other.

A description will now be made of the case where the tunnel film is evaluated from a relationship between a subthreshold swing and the time during which the DC stress is applied to the tunnel film, the relationship being found by taking the steps shown in FIG. 4 in the same way as in the first embodiment by means of the measuring MOS FET in FIG. 12.

Figure 13:
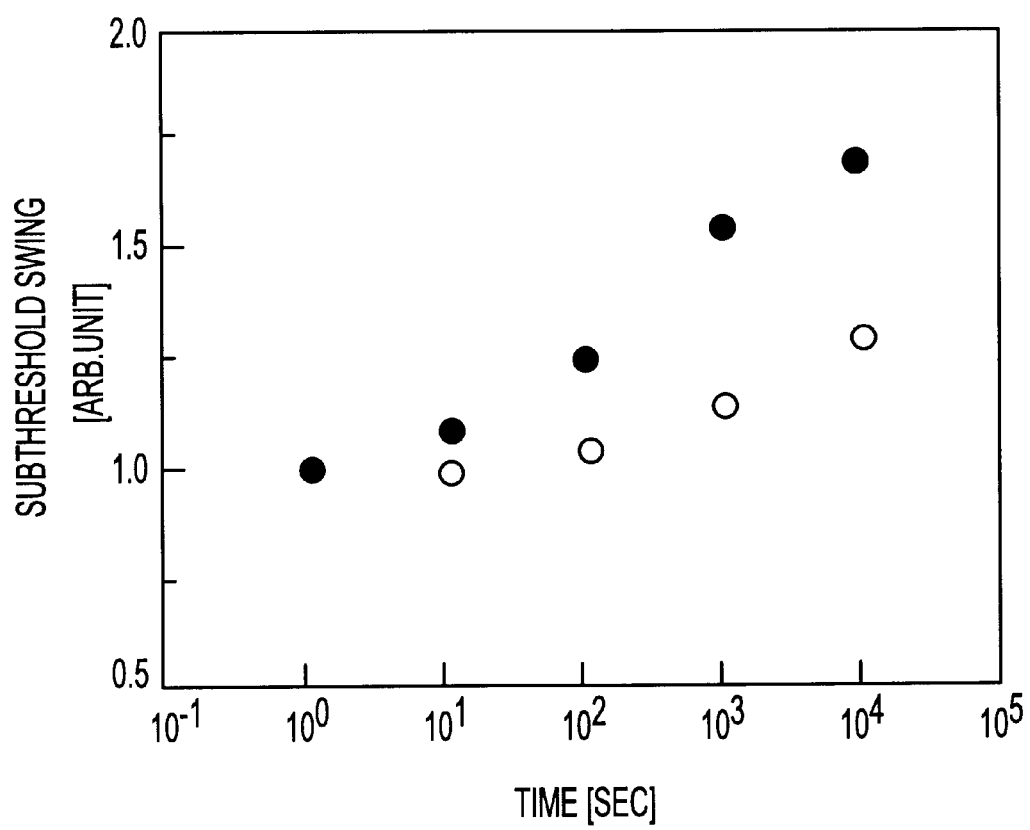
FIG. 13 is a graph for describing the relationship between the subthreshold swing and time the DC stress is applied according to the third embodiment of the present invention.

FIG. 13 is a graph for describing the relationship (represented by black points) between the time the DC stress is applied, the subthreshold swing of the measuring device shown in FIG. 12 and the relationship (represented by white points) between the time and the subthreshold swing of the measuring MOS FET shown in FIGS. 3a and 3b for the purpose of comparison.

As shown in FIG. 13, the subthreshold swing of the measuring device, which has a plurality of measuring MOS FETs, is changed by applying the DC stress to the tunnel film for a shorter time.

According to the third embodiment of the present invention, the method of evaluating the tunnel insulating film can shorten the time required to evaluate the tunnel insulating film by means of the measuring device which has a plurality of measuring MOS FETs.

Figure 14A:
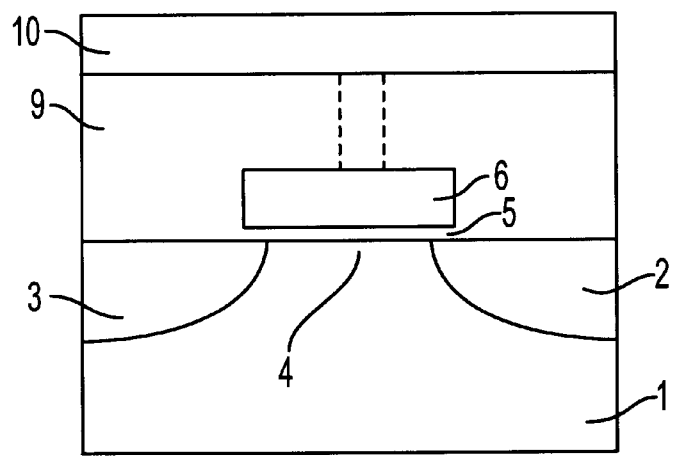
FIGS. 14a and 14b are sectional views showing another measuring semiconductor device used in the third embodiment of the present invention, particularly
Figure 14B:
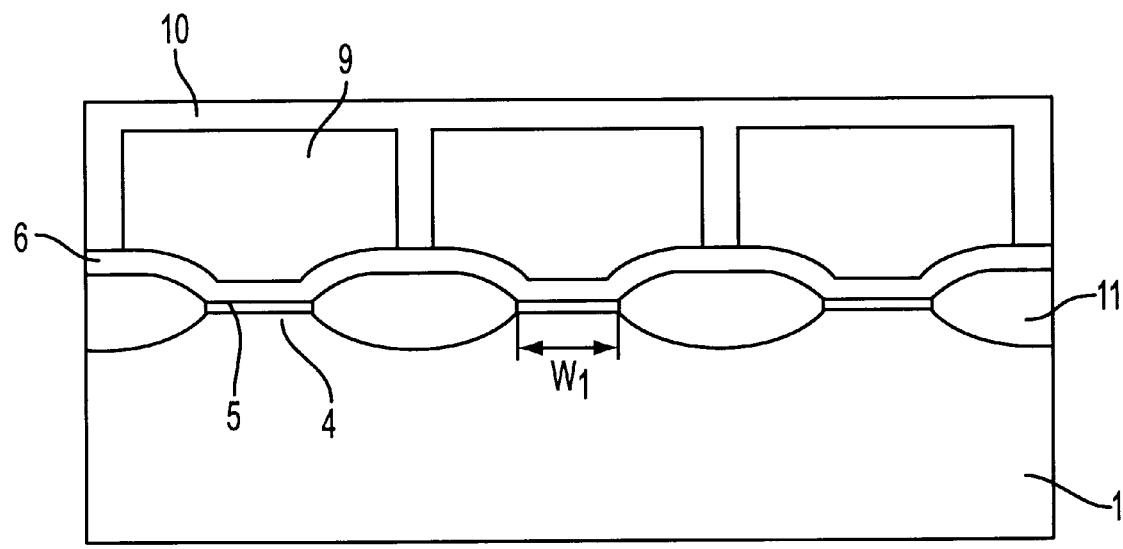

FIGS. 14a and 14b are sectional views showing another measuring semiconductor device used in the third embodiment of the present invention, particularly FIG. 14a is a vertical section along the direction of the source and drain regions and FIG. 14b is a vertical section along the direction perpendicular to FIG. 14a. The measuring device in FIGS. 14a and 14b, which has a structure with common gate 8 and SiO2 film 7 removed from the measuring device shown in FIG. 12 can be applied to the third embodiment instead of the measuring device in FIG. 12.

(Fourth embodiment of the present invention)

A description will now be made of the case where the tunnel film is evaluated from a relationship between a subthreshold swing and the time during which the DC stress is applied to the tunnel film, the relationship being found by taking the steps shown in FIG. 4 by means of the measuring MOS FET in FIGS. 3a and 3b. According to the fourth embodiment of the present invention, the gate 6 is applied a positive voltage of 9 V differently from the first embodiment so that the time required to increase a 10% subthreshold swing can shorten to half compared with the first embodiment of the present invention.

Figure 15:
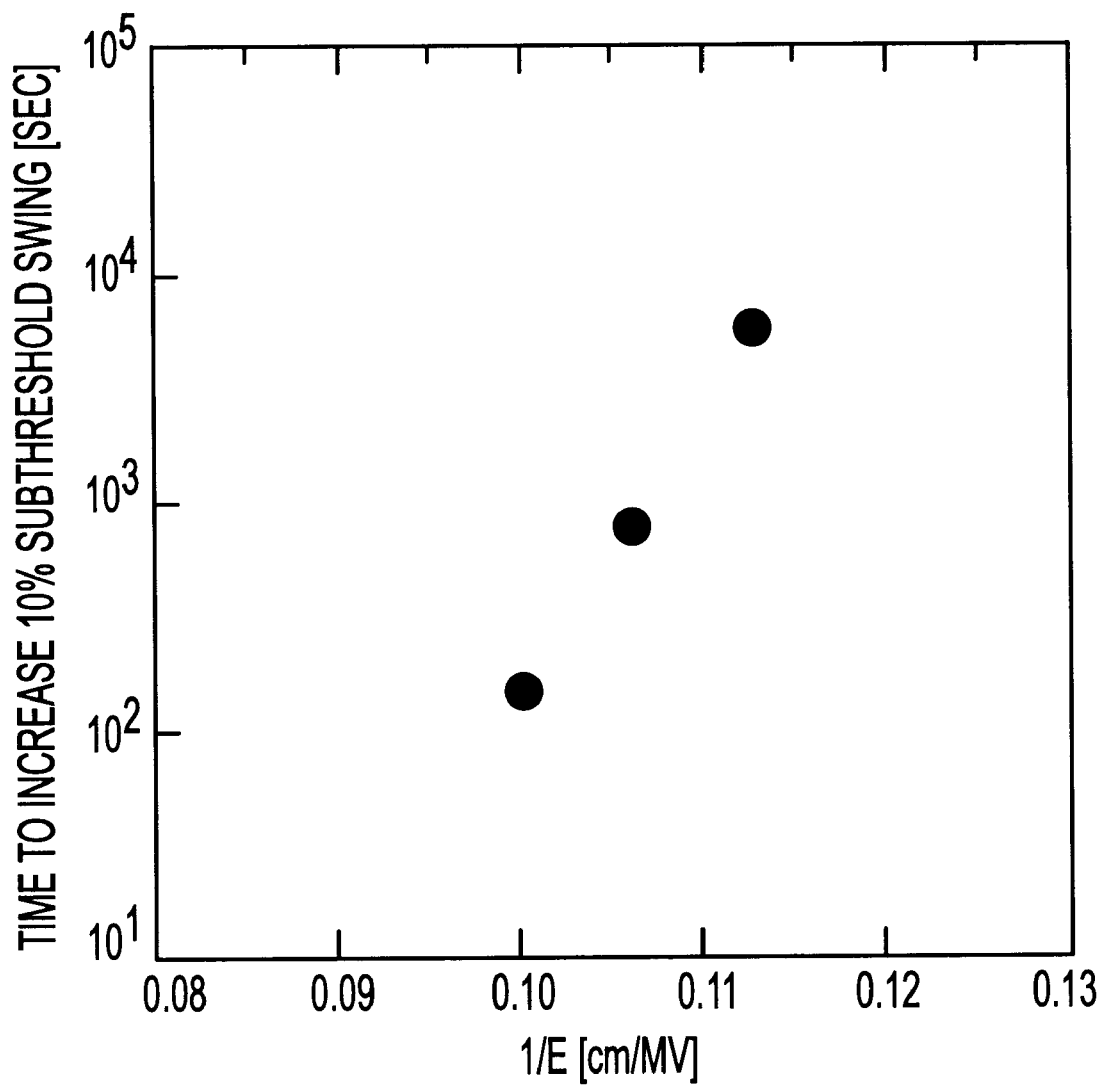
FIG. 15 is graph for describing the relationship between the inverse of the field applied to the tunnel film and the time the DC stress is applied to increase a 10% subthreshold swing.

FIG. 15 is a graph for describing the relationship between a number which is the inverse of the electric field applied to the tunnel film and the time during which the DC stress is applied to increase a 10% subthreshold swing. As shown in FIG. 1 5, the higher the electric field applied to the funnel film, the shorter the DC stress time to increase a 10% subthreshold swing.

According to the method of evaluating a tunnel insulating film of the present invention as described above, the tunnel insulating film can be evaluated from the change of the subthreshold swing before and after applying a predetermined DC stress on the measuring MOS FET, because it can be assumed that the tunnel film of the MOS FET to be evaluated and the tunnel insulating film have the same quality. As a result, the method of the present invention can shorten the time required to evaluate the tunnel insulating film.

What is claimed is:

1. A method of evaluating a tunnel insulating film in a first MOS FET having a semiconductor substrate, a control gate, a floating gate formed between the semiconductor substrate and the control gate and the tunnel insulating film formed between the semiconductor substrate and the floating gate, wherein the floating gate is injected with electrons from the semiconductor substrate by applying a direct current voltage between the control gate and the semiconductor substrate, said method comprising the steps of:

preparing a second MOS FET having a drain and a source, a tunnel insulating film formed on a surface of the semiconductor substrate in the same batch process of forming the tunnel insulating film in the first MOS FET, and a gate formed on the tunnel insulating film;

measuring a sub-threshold swing of the second MOS FET;

applying a predetermined direct current electric field to the tunnel insulating film by applying a direct current voltage between the semiconductor substrate and the gate in the second MOS FET for a predetermined period of time, the drain and the source being electrically connected to the semiconductor substrate;

re-measuring a sub-threshold swing of the second MOS FET; and evaluating the tunnel insulating film in the first MOS FET by using a change of the sub-threshold swing determined from the measuring steps before and after the applying step.

2. A method according to claim 1, further comprising steps repeating the applying step and the remeasuring step alternately.

3. A method according to claim 1, wherein the gate of the second MOS FET has a first gate and a second gate which is connected to the first gate through a insulating film between the first gate and the second gate.

4. A method according to claim 1, wherein the direct current electric field is higher than an electric field which is applied to the tunnel insulating film of the first MOS FET in order to inject electrons into the floating gate.

5. A method according to claim 1, wherein the second MOS FET has a channel area larger than that of the first MOS FET.

6. A method according to claim 1, wherein the second MOS FET includes a plurality of MOS FETs each having a tunnel insulating film formed on a surface of the semiconductor substrate in the same batch process of forming the tunnel insulating film in the first MOS FET, and a common gate to the MOS FETs formed on the tunnel insulating film, wherein the surface of the semiconductor substrate is defined by a field insulating film.

7. A method according to claim 6, wherein the common gate has a first common gate and a second common gate which is connected to the first common gate through a insulating film between the first common gate and the second common gate.

8. A method according to claim 6, wherein each of the MOS FETs in the second MOS FET has a channel area larger than that of the first MOS FET.

9. A method of evaluating a tunnel insulating film in a first MOS FET having a semiconductor substrate, a control gate, a floating gate formed between the semiconductor substrate and the control gate and the tunnel insulating film formed between the semiconductor substrate and the floating gate, wherein the floating gate is injected with electrons from the semiconductor substrate by applying a direct current voltage between the control gate and the semiconductor substrate, said method comprising the steps of:

preparing a second MOS FET having a tunnel insulating film formed on a surface of the semiconductor substrate in the same batch process of forming the tunnel insulating film in the first MOS FET, and first and second gates formed on the tunnel insulating film, the second gate being electrically connected to the first gate through an insulating film between the first gate and the second gate;

measuring a sub-threshold swing of the second MOS FET;

applying a predetermined direct current electric field to the tunnel insulating film by applying a direct current voltage between the semiconductor substrate and the gate in the second MOS FET for a predetermined period of time;

re-measuring a sub-threshold swing of the second MOS FET; and evaluating the tunnel insulating film in the first MOS FET by using a change of the sub-threshold swing determined from the measuring steps before and after the applying step.

* * * * *